United States Patent
Wei

(10) Patent No.: US 10,962,870 B2
(45) Date of Patent: Mar. 30, 2021

(54) LASER PROJECTION UNIT, DEPTH CAMERA AND ELECTRONIC DEVICE

(71) Applicant: GUANGDONG OPPO MOBILE TELECOMMUNICATIONS CORP., LTD., Guangdong (CN)

(72) Inventor: Yi Wei, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

(21) Appl. No.: 16/467,145

(22) PCT Filed: Feb. 18, 2019

(86) PCT No.: PCT/CN2019/075377
§ 371 (c)(1),
(2) Date: Jun. 6, 2019

(87) PCT Pub. No.: WO2019/174433
PCT Pub. Date: Sep. 19, 2019

(65) Prior Publication Data
US 2020/0233293 A1    Jul. 23, 2020

(30) Foreign Application Priority Data

Mar. 12, 2018   (CN) .......................... 201810200425.5
Mar. 12, 2018   (CN) .......................... 201810201139.0

(51) Int. Cl.
*G03B 21/20* (2006.01)
*G03B 17/54* (2021.01)
(Continued)

(52) U.S. Cl.
CPC ....... *G03B 21/2033* (2013.01); *G02B 6/4296* (2013.01); *G02B 7/021* (2013.01);
(Continued)

(58) Field of Classification Search
None
See application file for complete search history.

(56) References Cited

U.S. PATENT DOCUMENTS 4,241,990 A * 12/1980 Fisli ................... H04N 1/00254
                                                        355/66
6,016,202 A *  1/2000 Fuchs ..................... G01B 11/06
                                                        356/432
(Continued)

FOREIGN PATENT DOCUMENTS

CN   101077296      11/2007
CN   101421658       4/2009
(Continued)

OTHER PUBLICATIONS

EPO, Office Action for EP Application No. 19725917.9, dated Nov. 25, 2019.
(Continued)

*Primary Examiner* — Mohammad J Rahman
(74) *Attorney, Agent, or Firm* — Hodgson Russ LLP

(57) ABSTRACT

A laser projection unit, a depth camera and an electronic device are provided. The laser projection unit includes a light source, a collimation element and a diffractive optical element. The light source is configured to emit laser. The collimation element is configured to collimate the laser. The collimation element includes one or a plurality of lenses provided in a light emitting path of the light source. The diffractive optical element is configured to diffract the laser collimated by the diffractive collimation element to form a laser pattern.

18 Claims, 11 Drawing Sheets

(51) Int. Cl.
  *G02B 27/42* (2006.01)
  *G02B 27/30* (2006.01)
  *G02B 7/02* (2021.01)
  *G02B 6/42* (2006.01)
  *H01S 5/42* (2006.01)
  *H04N 5/225* (2006.01)

(52) U.S. Cl.
  CPC ......... *G02B 27/30* (2013.01); *G02B 27/4205* (2013.01); *G03B 17/54* (2013.01); *H01S 5/423* (2013.01); *H04N 5/2254* (2013.01)

(56) References Cited

U.S. PATENT DOCUMENTS

| | | | | |
|---|---|---|---|---|
| 6,158,659 | A * | 12/2000 | Dickson | G06K 7/10693 235/462.01 |
| 6,573,953 | B1 * | 6/2003 | Igasaki | G02F 1/135 349/113 |
| 10,802,291 | B1 * | 10/2020 | Pergola | G02B 5/04 |
| 2004/0004912 | A1 * | 1/2004 | Morishima | G11B 7/00455 369/44.32 |
| 2004/0056096 | A1 * | 3/2004 | Gurevich | G06K 7/10801 235/454 |
| 2005/0078383 | A1 * | 4/2005 | Jones | G02B 6/4206 359/717 |
| 2005/0213177 | A1 * | 9/2005 | Abe | G02B 26/125 359/206.1 |
| 2006/0086898 | A1 * | 4/2006 | Cheng | G03F 7/70316 250/236 |
| 2007/0019103 | A1 * | 1/2007 | Lieberman | G02B 27/4216 348/344 |
| 2007/0184639 | A1 * | 8/2007 | Tanaka | H01L 27/11226 438/487 |
| 2010/0118283 | A1 | 5/2010 | Aizawa et al. | |
| 2012/0074110 | A1 * | 3/2012 | Zediker | B23K 26/1224 219/121.72 |
| 2013/0335704 | A1 * | 12/2013 | Yates | A61B 3/0091 351/208 |
| 2014/0307299 | A1 * | 10/2014 | Matsumoto | B23K 26/0608 359/238 |
| 2015/0062539 | A1 | 3/2015 | Chang | |
| 2016/0004920 | A1 * | 1/2016 | Armstrong-Crews | G03B 35/00 348/46 |
| 2016/0357094 | A1 * | 12/2016 | Ishii | G03B 21/208 |
| 2016/0363440 | A1 * | 12/2016 | Stites | G01B 9/02098 |
| 2017/0075205 | A1 | 3/2017 | Kriman et al. | |
| 2017/0187997 | A1 * | 6/2017 | Hsiao | G01B 11/25 |
| 2017/0347043 | A1 * | 11/2017 | Rephaeli | G01B 11/24 |
| 2019/0039174 | A1 * | 2/2019 | Okuma | B23K 26/064 |
| 2019/0086776 | A1 * | 3/2019 | Hsiao | G03B 21/2033 |
| 2019/0273906 | A1 * | 9/2019 | Xiao | G02B 19/0014 |

FOREIGN PATENT DOCUMENTS

| | | |
|---|---|---|
| CN | 103080833 | 5/2013 |
| CN | 104090356 | 10/2014 |
| CN | 106199783 | 12/2016 |
| CN | 106569382 | 4/2017 |
| CN | 107167997 | 9/2017 |
| CN | 107357123 | 11/2017 |
| CN | 107608167 | 1/2018 |
| CN | 206833136 | 1/2018 |
| CN | 206877018 | 1/2018 |
| CN | 107741682 | 2/2018 |
| CN | 107783258 | 3/2018 |
| CN | 108508619 | 9/2018 |
| CN | 108594449 | 9/2018 |
| DE | 102017205590 | 12/2017 |
| JP | 2009217005 | 9/2009 |
| JP | 2015132666 | 7/2015 |
| JP | 2017059742 | 3/2017 |
| KR | 20100048092 | 5/2010 |
| TW | 201514544 | 4/2015 |

OTHER PUBLICATIONS

SIPO, First Office Action for CN Application No. 201810200425, dated May 17, 2019.
SIPO, First Office Action for CN Application No. 201810201139, dated May 13, 2019.
WIPO, ISR for PCT/CN2019/075377, May 27, 2019.
SIPO, Office Action for CN Application No. 201810201139.0, dated Oct. 15, 2019.
TIPO, Office Action for TW Application No. 108108331, dated Aug. 26, 2019.
EPO, Office Action for EP Application No. 19725917.9, dated Jun. 18, 2020.

* cited by examiner

# LASER PROJECTION UNIT, DEPTH CAMERA AND ELECTRONIC DEVICE

CROSS-REFERENCE TO RELATED APPLICATION

This application is a U.S. national phase application of International Application No. PCT/CN2019/075377, filed on Feb. 18, 2019, which claims priority to and benefit of Chinese Patent Applications 201810201139.0 and 201810200425.5 filed on Mar. 12, 2018, the entire disclosures of which are hereby incorporated herein by reference.

FIELD

The present application relates to a field of imaging technology, and particularly, to a laser projection unit, a depth camera and an electronic device.

BACKGROUND

The laser projection unit includes a light source, a collimation element and a diffractive optical element (DOE). The collimation element generally includes a lens structure.

SUMMARY

Embodiments of the present application provide a laser projection unit, a depth camera and an electronic device.

The laser projection unit according to embodiments of the present application includes a light source, a collimation element and a diffractive optical element. The light source is configured to emit laser. The collimation element is configured to collimate the laser, and includes one or a plurality of lenses. The one or the plurality of lenses are provided in a light emitting path of the light source. The diffractive optical element is configured to diffract the laser collimated by the collimation element to form a laser pattern.

The depth camera according to embodiments of the present application includes the laser projection unit according to the above embodiments, an image acquirer and a processor. The image acquirer is configured to acquire a laser pattern projected into a target space after passing through the diffractive optical element. The processor is coupled to the laser projection unit and the image acquirer separately, and is configured to process the laser pattern to obtain a depth image.

The electronic device according to embodiments of the present application includes a housing and the depth camera according to the above embodiments. The depth camera is provided in the housing and exposed out of the housing to acquire the depth image.

Additional aspects and advantages of embodiments of the present application will be given in the following description, some of which will become apparent from the following description or be learned from practices of the present application.

BRIEF DESCRIPTION OF THE DRAWINGS

The above and/or additional aspects and advantages of the present application will become apparent and easy to understand from descriptions of the embodiments with reference to the drawings, in which.

DETAILED DESCRIPTION

Figure 1:
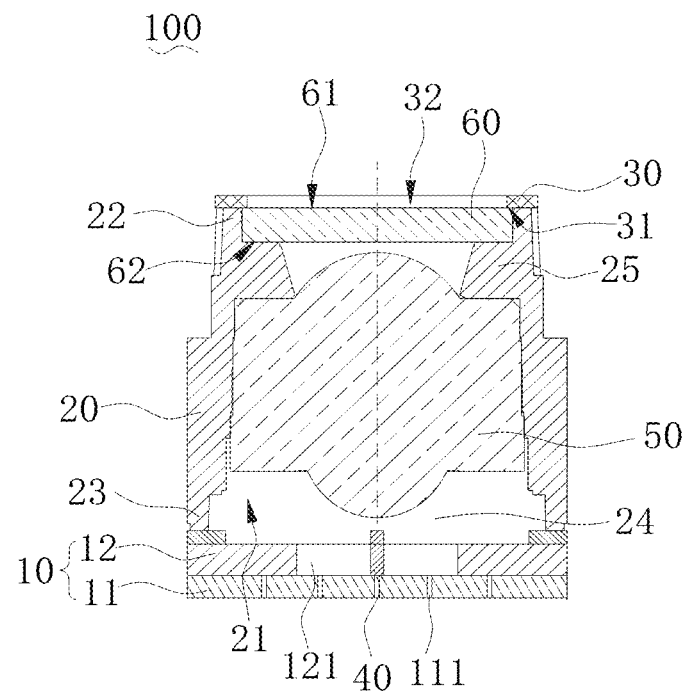
FIG. 1 is a schematic view of a laser projection unit according to some embodiments of the present application.

Embodiments of the present application are described below in detail, examples of the embodiments are shown in accompanying drawings, and the same or similar reference numerals are used to refer to the same or similar elements or elements having the same or similar functions. The embodiments described below with reference to the accompanying drawings are exemplary, are merely used to explain the present application, and cannot be construed as a limit to the present application.

In the descriptions of the embodiments of the present application, it is to be understood that, terms such as "center", "longitudinal", "lateral", "length", "width", "thickness", "upper", "lower", "front", "rear", "left", "right", "vertical", "horizontal", "top", "bottom", "inner", "outer", "clockwise" and "counterclockwise" should be construed to refer to the orientation as then described or as shown in the drawings under discussion, These relative terms are for convenience of description and do not require that the present disclosure be constructed or operated in a particular orientation, which cannot be construed as a limit to the present application. In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present invention, "a plurality of" means two or more than two, unless specified otherwise.

In the descriptions of the embodiments of the present application, it should be noted that, unless otherwise expressly specified and limited, terms "mounted", "connected", and "coupled" are used broadly and may be, for example, fixed connections, detachable connections, or integrated connections; may also be mechanical or electrical connections; may also be direct connections, indirect connections via intervening structures; may also be inner communications or interactions of two elements, which can be understood by those skilled in the art according to specific situations.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

As illustrated in FIG. 1, the laser projection unit 100 according to embodiments of the present application includes a light source 40, a collimation element 50 and a diffractive optical element 60. The light source 40 is configured to emit laser. The collimation element 50 is configured to collimate the laser. The collimation element 50 includes one or a plurality of lenses provided in a light emitting path of the light source 40. The diffractive optical element 60 is configured to diffract the laser collimated by the collimation element 50 to form a laser pattern.

As illustrated in FIG. 1, in some embodiments, the one or plurality of lenses are made of plastic.

Figure 5:
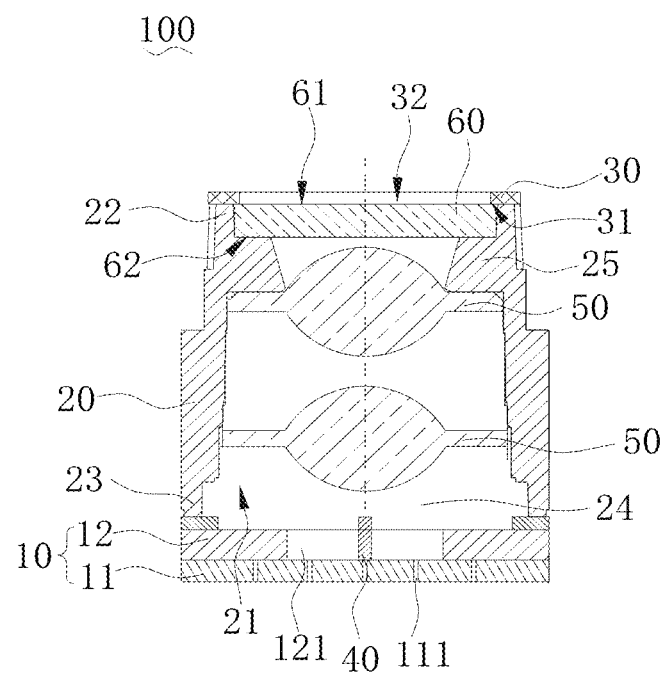
FIG. 5 is a schematic view of a laser projection unit according to some embodiments of the present application.

As illustrated in FIG. 5, in some embodiments, the collimation element 50 includes the plurality of the lenses. The plurality of the lenses include at least one first type lens and at least one second type lens. The first type lens is made of glass, and the second type lens is made of plastic.

Figure 6:
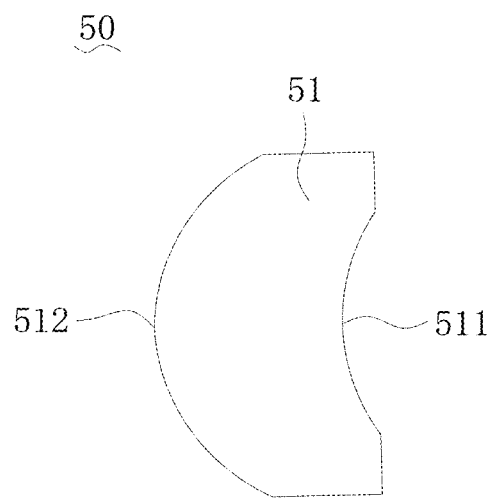
FIGS. 6 to 18 are partial schematic views of a collimation element of a laser projection unit according to some embodiments of the present application.

As illustrated in FIG. 1 and FIG. 6, in some embodiments, the collimation element 50 includes a first lens 51. The first lens 51 includes a first light incident face 511 and a first light emitting face 512 opposite to each other. The first light incident face 511 is a concave face, and the first light emitting face 512 is a convex face.

As illustrated in FIG. 5, in some embodiments, the collimation element 50 includes the plurality of lenses. The plurality of lenses are coaxial with each other and provided in the light emitting path of the light source 40 in sequence.

Figure 7:
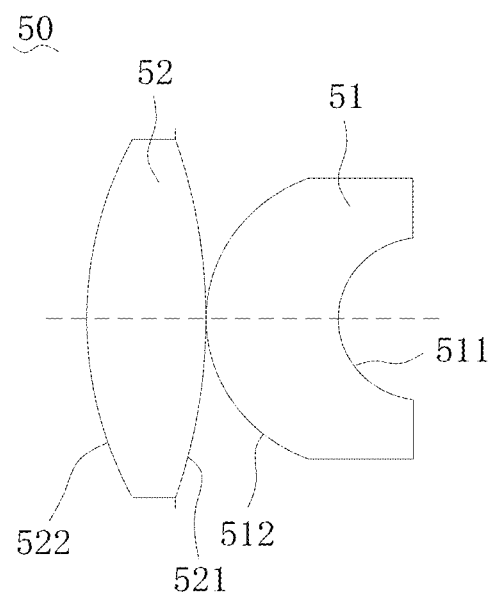

As illustrated in FIG. 1 and FIG. 7, in some embodiments, the plurality of lenses include the first lens 51 and the second lens 52. The first lens 51 includes the first light incident face 511 and the first light emitting face 512 opposite to each other. The second lens 52 includes a second light incident face 521 and a second light emitting face 522 opposite to each other. An apex of the first light emitting face 512 abuts against an apex of the second light incident face 521. The first light incident face 511 is a concave face and the second light emitting face 522 is a convex face.

As illustrated in FIG. 7, in some embodiments, the first light emitting face 512 and the second light incident face 521 are both convex faces.

Figure 8:
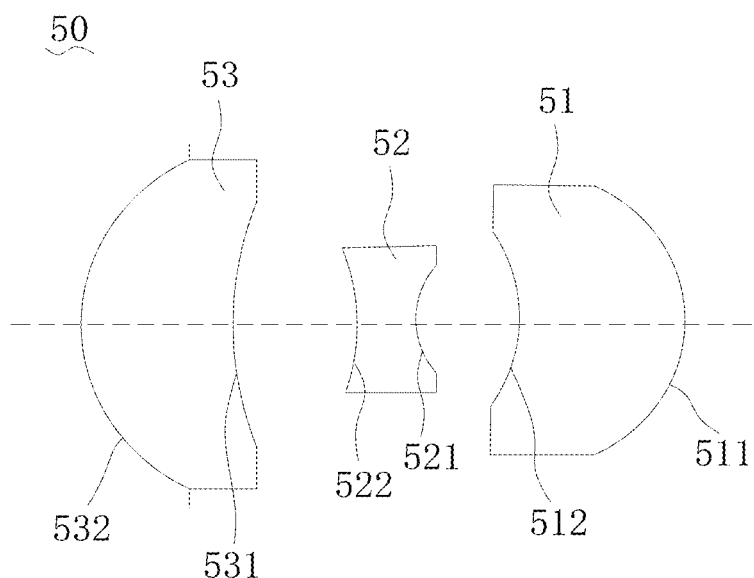

As illustrated in FIG. 1 and FIG. 8, in some embodiments, the plurality of lenses include the first lens 51, the second lens 52 and a third lens 53. The first lens 51 includes the first light incident face 511 and the first light emitting face 512 opposite to each other. The second lens 52 includes the second light incident face 521 and the second light emitting face 522 opposite to each other. The third lens 53 includes a third light incident face 531 and a third light emitting face 532 opposite to each other. The third light incident face 531 is a concave face, and the third light emitting face 532 is a convex face.

As illustrated in FIG. 8, in some embodiments, the first light incident face 511 is a convex face, and the first light emitting face 512 is a concave face. The second light incident face 521 is a concave face, and the second light emitting face 522 is a concave face.

As illustrated in FIG. 8, in some embodiments, the plurality of lenses include the first lens 51, the second lens 52 and the third lens 53. The first lens 51 is the first type lens, and the second lens 52 and the third lens 53 are the second type lenses; or the second lens 52 is the first type lens, and the first lens 51 and the third lens 53 are the second type lenses; or the third lens 53 is the first type lens, and the first lens 51 and the second lens 52 are the second type lenses; or the first lens 51 and the second lens 52 are the first type lenses, and the third lens 53 is the second type lens; or the second lens 52 and the third lens 53 are the first type lenses, and the first lens 51 is the second type lens; or the first lens 51 and the third lens 53 are the first type lenses, and the second lens 52 is the second type lens.

Figure 9:
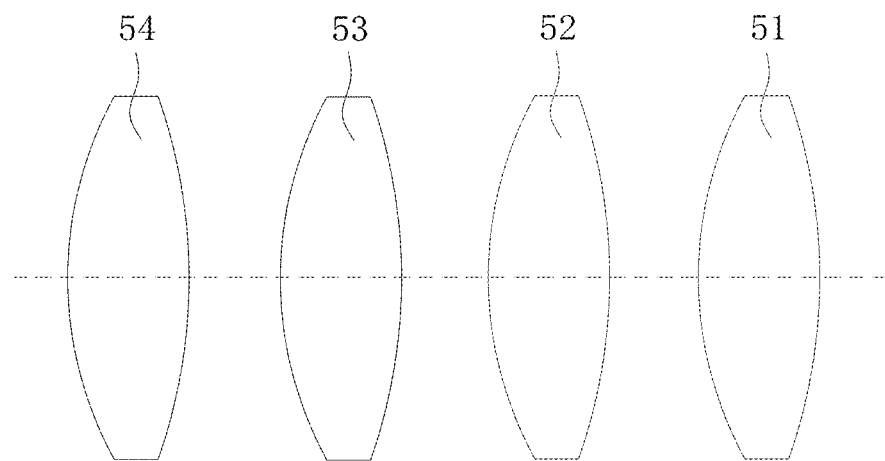

As illustrated in FIG. 5 and FIG. 9, in some embodiments, the plurality of lenses include four lenses. Two of the four lenses are the first type lenses, and the other two of the four lenses are the second type lenses; or one of the four lenses is the first type lens, and the other three of the four lenses are the second type lenses; or three of the four lenses are the first type lenses, and the other one of the four lenses is the second type lens.

Figure 10:
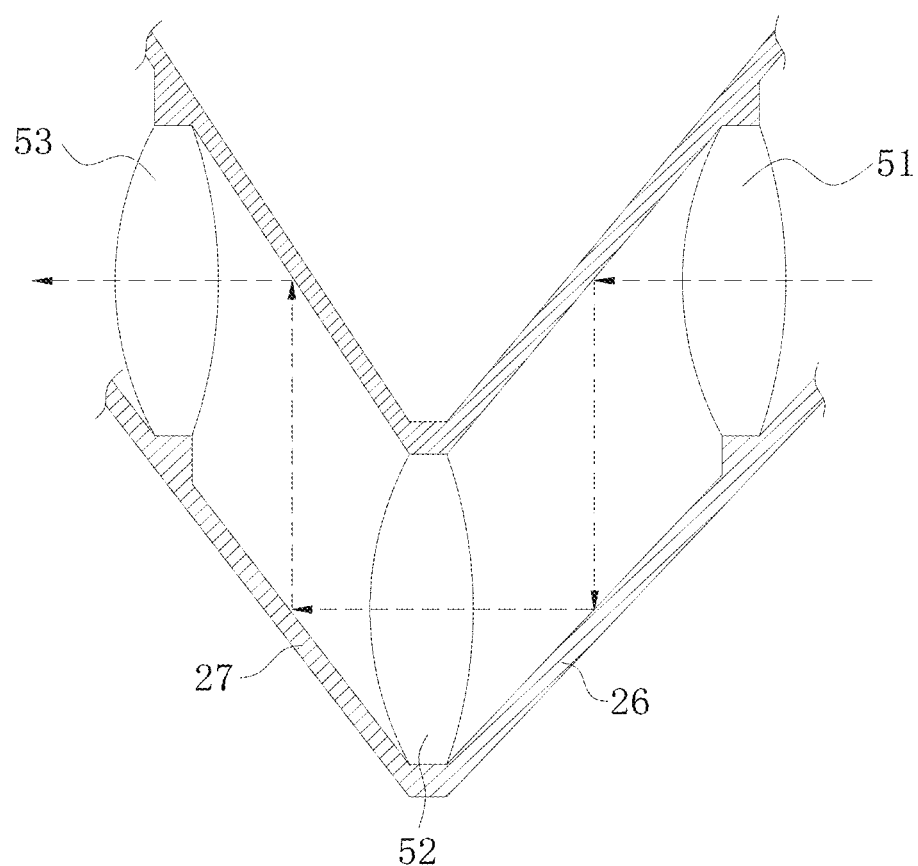

As illustrated in FIG. 5 and FIG. 10, in some embodiments, the collimation element 50 includes the plurality of lenses provided in the light emitting path of the light source 40. An optical axis of at least one of the plurality of lenses is offset relative to an optical axis of each of the rest of the plurality of lenses.

Figure 16:
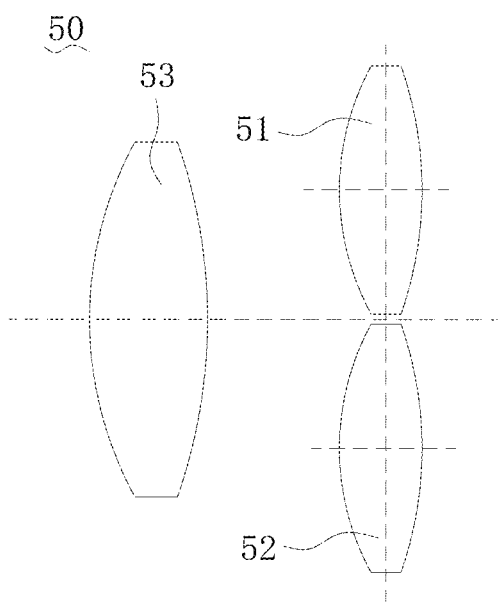

As illustrated in FIG. 5 and FIG. 16, in some embodiments, the collimation element 50 includes the plurality of lenses. Optical centers of at least two of the lenses are located in the same plane perpendicular to a first direction, and the first direction is a direction from the light source 40 to the diffractive optical element 60.

As illustrated in FIG. 10 and FIG. 16, in some embodiments, the optical axis of the at least one of the plurality of lenses is parallel to an optical axis of the rest of the plurality of lenses.

As illustrated in FIG. 1, in some embodiments, the light source 40 is a vertical cavity surface emitting laser; or the light source 40 is an edge-emitting laser.

Figure 2:
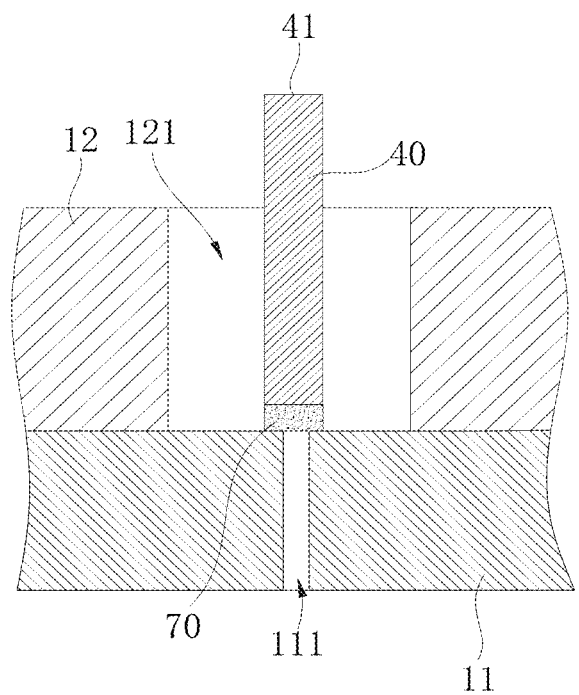
FIGS. 2 to 4 are partial schematic views of a laser projection unit according to some embodiments of the present application.

As illustrated in FIG. 1 and FIG. 2, in some embodiments, the light source 40 is the edge-emitting laser. The light source 40 includes the light emitting face 41 and the light emitting face 41 faces the light collimation element 50.

As illustrated in FIG. 1, in some embodiments, the laser projection unit 100 further includes a substrate assembly 10 and a lens barrel 20. The lens barrel 20 is provided to the substrate assembly 10 and defines an accommodating chamber 21 together with the substrate assembly 10. The light source 40, the collimation element 50 and the diffractive optical element 60 are accommodated in the accommodating chamber 21.

As illustrated in FIG. 1, in some embodiments, the substrate assembly 10 includes a substrate 11 and a circuit board 12 supported on the substrate 11. The circuit board 12 is defines a via hole 121 therein, and the light source 40 is supported on the substrate 11 and accommodated in the via hole 121.

Figure 19:
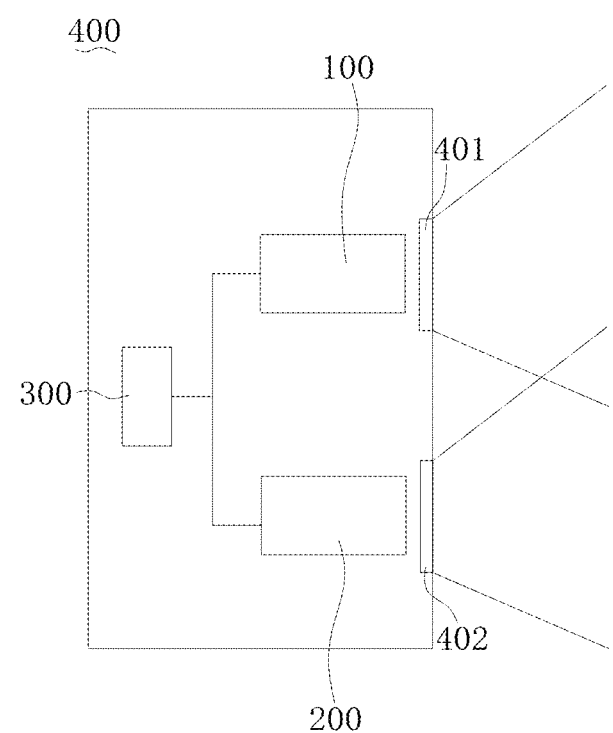
FIG. 19 is a schematic view of a depth camera according to some embodiments of the present application.

As illustrated in FIG. 19, a depth camera 400 according to embodiments of the present application includes the laser projection unit 100, an image acquirer 200 and a processor 300. The image acquirer 200 is configured to acquire a laser pattern projected into a target space after passing through the diffractive optical element 60. The processor 300 is coupled to the laser projection unit 100 and the image acquirer 200 separately, and is configured to process the laser pattern to obtain a depth image.

Figure 20:
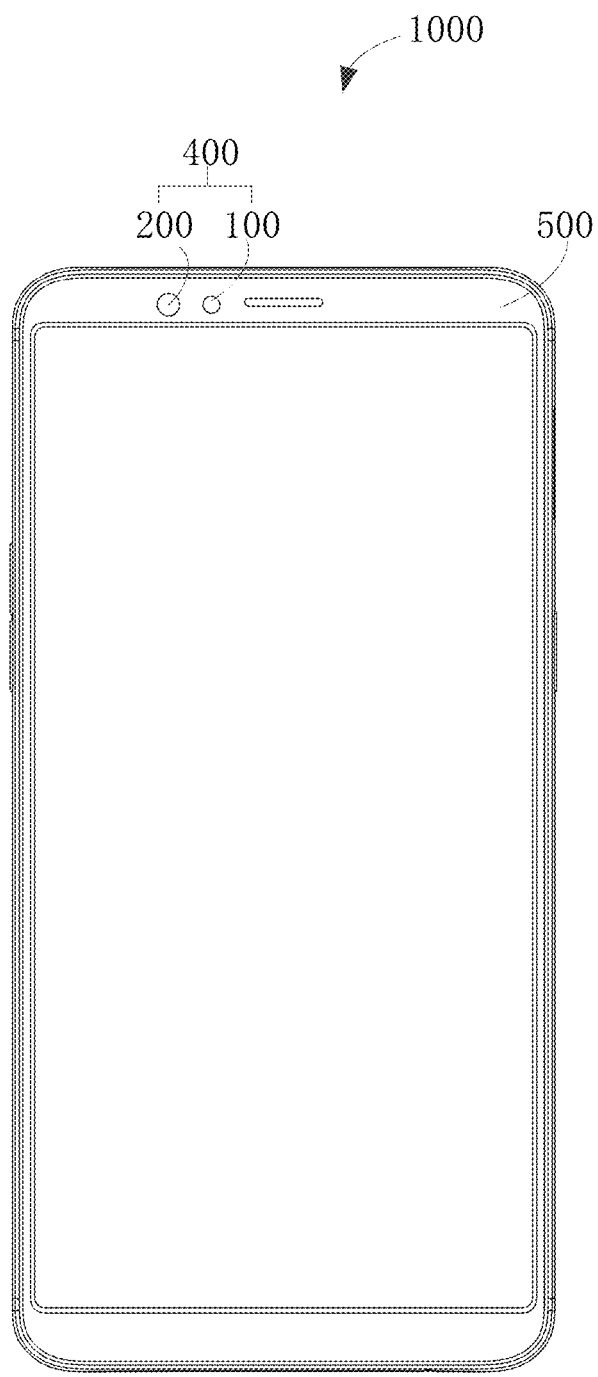
FIG. 20 is a schematic view of an electronic device according to some embodiments of the present application.

As illustrated in FIG. 20, an electronic device 1000 according to embodiments of the present application includes a housing 500 and the depth camera 400. The depth camera 400 is provided in the housing 500 and exposed out of the housing 500 to acquire the depth image.

As illustrated in FIG. 1, the laser projection unit 100 according to embodiments of the present application includes the substrate assembly 10, the lens barrel 20, a protective cover 30, the light source 40, the collimation element 50 and the diffractive optical element 60.

The substrate assembly 10 includes a substrate 11 and a circuit board 12 supported on the substrate 11. The substrate 11 may be made of plastic, such as any one or more of polyethylene glycol terephthalate (PET), polymethyl methacrylate (PMMA), polycarbonate (PC) and polyimide (PI). Thus, the substrate 11 has a less weight and enough supporting strength. The circuit board 12 may be a rigid board, a flexible board or a rigid-flex board. The circuit board 12 is provided with a via hole 121. The light source 40 is fixed to the substrate 11 through the via hole 121 and electronically connected to the circuit board 12. The substrate 11 may be provided with a heat-dissipation hole 111, and heat generated by the operation of the light source 40 or the circuit board 12 can be dissipated through the heat-dissipation hole 111. The heat-dissipation hole 111 may be further filled with heat-conducting adhesive so as to further improve the heat dissipation performance of the substrate assembly 10.

The lens barrel 20 is provided to the substrate assembly 10 and defines the accommodating chamber 21 together with the substrate assembly 10. The light source 40, the collimation element 50 and the diffractive optical element 60 are all accommodated in the accommodating chamber 21. The collimation element 50 and the diffractive optical element 60 are sequentially provided in the light emitting path of the light source 40. The lens barrel 20 includes a top portion 22 and a bottom portion 23 opposite to each other. The lens barrel 20 defines a through hole 24 running through the top portion 22 and the bottom portion 23. The bottom portion 23 is supported on the substrate assembly 10, and specifically, may be fixed to the circuit board 12 by means of adhesive. An annular supporting stage 25 extends from an inner wall of the lens barrel 20 towards a center of the through hole 24, and the diffractive optical element 60 is supported on the supporting stage 25.

The protective cover 30 is provided to the top portion 22, and includes an abutment face 31 located in the accommodating chamber 21 and opposite to the substrate 11. The protective cover 30 and the supporting stage 25 respectively abut against the diffractive optical element 60 from two opposite sides of the diffractive optical element 60. The abutment face 31 is a face of the protective cover 30 abutting against the diffractive optical element 60. The laser projection unit 100 employs the protective cover 30 to abut against the diffractive optical element 60, such that the diffractive optical element 60 is accommodated in the accommodating chamber 21 and the diffractive optical element 60 may be prevented from falling off along the light emitting direction.

In some embodiments, the protective cover 30 may be made of a metallic material such as the silver nanowire, metal silver wire and copper sheet. The protective cover 30 defines a light passage hole 32 therein. The light passage hole 32 aligns with the through hole 24. The light passage hole 32 is configured to emit the laser pattern projected by the diffractive optical element 60. An aperture size of the light passage hole 32 is smaller than at least one of a width or a length of the diffractive optical element 60 so as to restrict the diffractive optical element 60 within the accommodating chamber 21.

In some embodiments, the protective cover 30 may be made of a light-transmitting material such as glass, polymethyl methacrylate (PMMA), polycarbonate (PC) and polyimide (PI). Since light-transmitting materials like glass, PMMA, PC and PI have excellent light-transmitting performance, the protective cover 30 does not need to define the light passage hole 32 therein. In this way, while keeping the diffractive optical element 60 from falling off, the protective cover 30 may prevent the diffractive optical element 60 from exposing out of the lens barrel 20, thus protecting the diffractive optical element 60 against water and dust.

Figure 3:
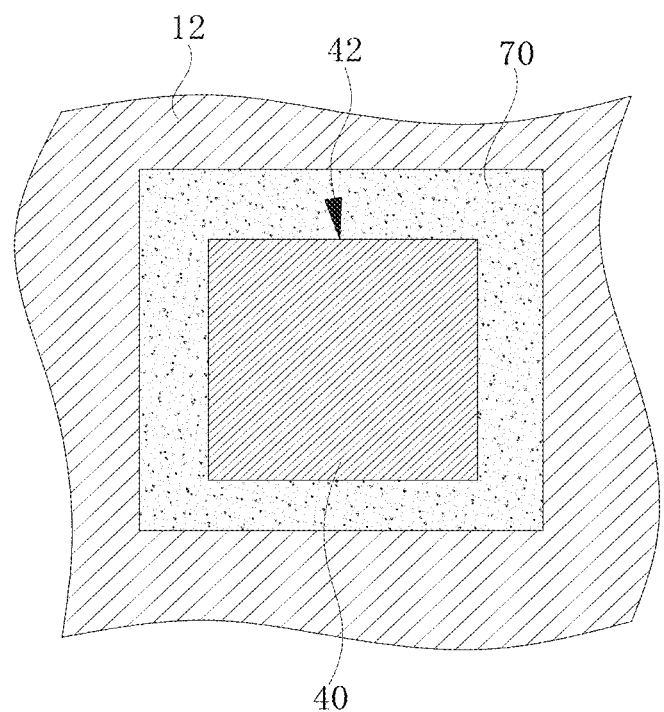

The light source 40 is configured to emit laser. The light source 40 may be a vertical cavity surface emitting laser (VCSEL) or an edge-emitting laser (EEL). In embodiments illustrated in FIG. 1, the light source 40 is an edge-emitting laser, and specifically, the light source 40 may be a distributed feedback laser (DFB). The light source 40 is configured to emit laser into the accommodating chamber 21. In combination with FIG. 2, the light source 40 has a columnar shape as a whole, and an end face of the light source 40 away from the substrate assembly 10 forms the light emitting face 41. The laser is emitted from the light emitting face 41 and the light emitting face 41 faces the collimation element 50. Moreover, the light emitting face 41 is perpendicular to a collimating light axis of the collimation element 50, and the collimating light axis passes through a center of the light emitting face 51. The light source 40 is fixed to the substrate assembly 10. Specifically, the light source 40 may be adhered to the substrate assembly 10 by a sealing adhesive 70. For instance, a face of the light source 40 opposite to the light emitting face 41 is adhered to the substrate assembly 10. Referring to FIG. 1 and FIG. 3, a side face 42 of the light source 40 may also be adhered to the substrate assembly 10. The sealing adhesive 70 wraps around the side faces 42. It is also conceivable that only one face of the side faces 42 adheres to the substrate assembly 10 or several faces of the side faces 42 adhere to the substrate assembly 10. In this case, the sealing adhesive 70 may be a heat-conducting adhesive to conduct heat generated by the operation of the light source 40 to the substrate assembly 10.

The edge-emitting laser is adopted as the light source 40 of the laser projection unit 100. On the one hand, the temperature drift of the edge-emitting laser is less than that of a VCSEL array. On the other hand, since the edge-emitting laser is a single-point light emitting structure, it is not necessary to design an array structure, the manufacturing is simple, so that the light source 40 of the laser projection unit 100 is low in cost.

When the laser of the distributed feedback laser propagates, gain of power is obtained through feedback of a grating structure. In order to enhance the power of the distributed feedback laser, it is necessary to increase an injection current and/or increase a length of the distributed feedback laser. As the injection current increases, power consumption of the distributed feedback laser increases and severe heat generation is resulted, in order to ensure that the distributed feedback laser can operate normally, it is required to increase the length of the distributed feedback laser, such that the distributed feedback laser generally has a slender strip structure. When the light emitting face 41 of the edge-emitting laser faces the collimation element 50, the edge-emitting laser is arranged vertically. Since the edge-emitting laser has the slender strip structure, the edge-emitting laser is prone to accidents such as dropping, shifting or shaking. The edge-emitting laser can be secured by providing the sealing adhesive 70 so as to avoid accidents such as dropping, shifting or shaking of the edge-emitting laser.

Figure 4:
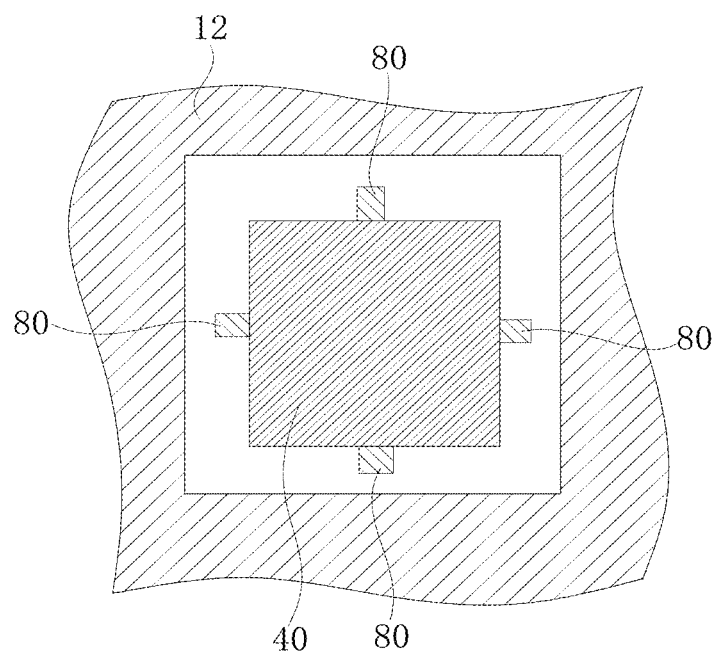

In some embodiments, the light source 40 may also be fixed to the substrate assembly 10 by a fixing method as illustrated in FIG. 4. Specifically, the laser projection unit 100 includes a plurality of supporting blocks 80. The supporting blocks 80 may be fixed to the substrate assembly 10. The plurality of supporting blocks 80 surround the light source 40 together, and the light source 40 may be directly installed among the plurality of supporting blocks 80 upon installation. In an embodiment, the plurality of supporting blocks 80 clamps the light source 40 jointly to further prevent the light source 40 from shaking.

The collimation element 50 is configured to collimate the laser emitted by the light source 40. The collimation element 50 is fixed to the lens barrel 20, and the supporting stage 25 is located between the collimation element 50 and the diffractive optical element 60. The collimation element 50 includes one or a plurality of lenses provided in the light emitting path of the light source 40. As illustrated in FIG. 1, in one embodiment, the one or the plurality of lenses can be made of plastic. Since lenses of the collimation element 50 are all made of plastic, the cost is rather low, thus helping achieve a mass production. As illustrated in FIG. 5, in another embodiment, the collimation element 50 includes the plurality of lenses provided in the light emitting path of the light source 40. The plurality of lenses include at least one first type lens and at least one second type lens, the first type lens is made of glass and the second type lens is made of plastic. As the first type lens is made of glass, the temperature drift occurred to the lens during environmental temperature changes is solved. And as the second type lens is made of plastic, the cost is rather low, thus helping achieve the mass production.

As illustrated in FIG. 1 and FIG. 6, in some embodiments, the collimation element 50 may only include the first lens 51, and the first lens 51 includes the first light incident face 511 and the first light emitting face 512 opposite to each other. The first light incident face 511 is a face of the first lens 51 adjacent to the light source 40, and the first light emitting face 512 is a face of the first lens 51 adjacent to the diffractive optical element 60. The first light incident face 511 is a concave face and the first light emitting face 512 is a convex face. A profile of the first lens 51 may be an aspheric face, a spherical face, a Fresnel face or a binary optical face. A diaphragm is provided between the light source 40 and the first lens 51 to restrict light beams.

In some embodiments, the collimation element 50 may include the plurality of lenses, and the plurality of lenses are coaxial with each other and provided in the light emitting path of the light source 40 in sequence. The profile of each lens may be any one of the aspheric face, the spherical face, the Fresnel face and the binary optical face.

For example, as illustrated in FIG. 1 and FIG. 7, the plurality of lenses may include the first lens 51 and the second lens 52. The first lens 51 and the second lens 52 are coaxial with each other and provided in the light emitting path of the light source 40 in sequence. The first lens 51 includes the first light incident face 511 and the first light emitting face 512 opposite to each other. The first light incident face 511 is a face of the first lens 51 adjacent to the light source 40, and the first light emitting face 512 is a face of the first lens 51 adjacent to the diffractive optical element 60. The second lens 52 includes the second light incident face 521 and the second light emitting face 522 opposite to each other. The second light incident face 521 is a face of the second lens 52 adjacent to the light source 40, and the second light emitting face 522 is a face of the second lens 52 adjacent to the diffractive optical element 60. An apex of the first light emitting face 512 abuts against an apex of the second light incident face 521, the first light incident face 511 is a concave face and the second light emitting face 522 is a convex face. A diaphragm is provided to the second light incident face 521 to restrict light beams. Furthermore, the first light emitting face 512 and the second light incident face 521 are both convex faces. Thus, it is convenient for the apex of the first light emitting face 512 to abut against the apex of the second light incident face 521. A curvature radius of the first light emitting face 512 is smaller than a curvature of the second light incident face 521.

In the collimation element 50 illustrated in FIG. 7, the first lens 51 is the first type lens, and the second lens 52 is the second type lens. That is, the first lens 51 is made of glass, and the second lens 52 is made of plastic. Or, the second lens 52 is the first type lens, and the first lens 51 is the second type lens. That is, the second lens 52 is made of glass, and the first lens 51 is made of plastic.

As illustrated in FIG. 1 and FIG. 8, the plurality of lenses may also include the first lens 51, the second lens 52 and the third lens 53. The first lens 51, the second lens 52 and the third lens 53 are coaxial with one another and provided in the light emitting path of the light source 40 in sequence. The first lens 51 includes the first light incident face 511 and the first light emitting face 512 opposite to each other. The first light incident face 511 is the face of the first lens 51 adjacent to the light source 40, and the first light emitting face 512 is the face of the first lens 51 adjacent to the diffractive optical element 60. The second lens 52 includes the second light incident face 521 and the second light emitting face 522 opposite to each other. The second light incident face 521 is the face of the second lens 52 adjacent to the light source 40, and the second light emitting face 522 is the face of the second lens 52 adjacent to the diffractive optical element 60. The third lens 53 includes a third light incident face 531 and a third light emitting face 532 opposite to each other. The third light incident face 531 is a face of the third lens 53 adjacent to the light source 40, and the third light emitting face 532 is a face of the third lens 53 adjacent to the diffractive optical element 60. The third light incident face 531 is a concave face and the third light emitting face 532 is a convex face. A diaphragm is provided to the third light emitting face 532 to restrict light beams. Furthermore, the first light incident face 511 is a convex face, the first light emitting face 512 is a concave face, the second light incident face 521 is a concave face and the second light emitting face 522 is a concave face.

In the collimation element 50 illustrated in FIG. 8, the first lens 51 is the first type lens, and the second lens 52 and a third lens 53 are the second type lenses; or the second lens 52 is the first type lens, and the first lens 51 and the third lens 53 are the second type lenses; or the third lens 53 is the first type lens, and the first lens 51 and the second lens 52 are the second type lenses; or the first lens 51 and the second lens 52 are the first type lenses, and the third lens 53 is the second type lens; or the second lens 52 and the third lens 53 are the first type lenses, and the first lens 51 is the second type lens; or the first lens 51 and the third lens 53 are the first type lenses, and the second lens 52 is the second type lens.

As illustrated in FIG. 5 and FIG. 9, the plurality of lenses may also include the first lens 51, the second lens 52, the third lens 53 and a fourth lens 54. Two of the four lenses are the first type lenses, and the other two of the four lenses are the second type lenses. For example, the first lens 51 and the second lens 52 are the first type lenses, and the third lens 53 and the fourth lens 54 are the second type lenses. Alternatively, one of the four lenses is the first type lens, and the other three of the four lenses are the second type lenses. For example, the first lens 51 is the first type lens, and the second lens 52, the third lens 53 and the fourth lens 54 are the second type lenses. Alternatively, three of the four lenses are the first type lenses, and the other one of the four lenses is the second type lens. For example, the first lens 51, the second lens 52 and the third lens 53 are the first type lenses, and the fourth lens 54 is the second type lens.

Of course, in other embodiments, the plurality of lenses may include a larger number of lenses as long as the plurality of lenses include at least one first type lens and at least one second type lens.

In some embodiments, the collimation element 50 includes the plurality of lenses. The plurality of lenses are provided in the light emitting path of the light source 40 in sequence. An optical axis of at least one of the plurality of lenses is offset relative to an optical axis of each of the rest of the plurality of lenses. In this case, the lens barrel 20 may have a one-segment or multi-segment structure, and each segment structure is configured to install corresponding lenses.

Figure 11:
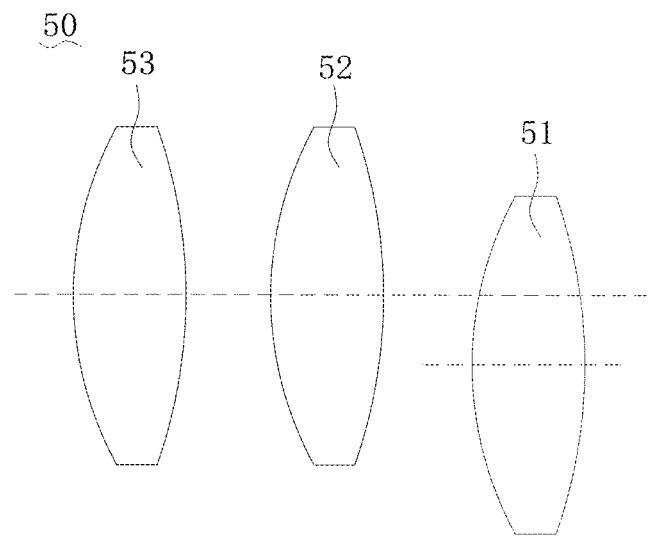
Figure 12:
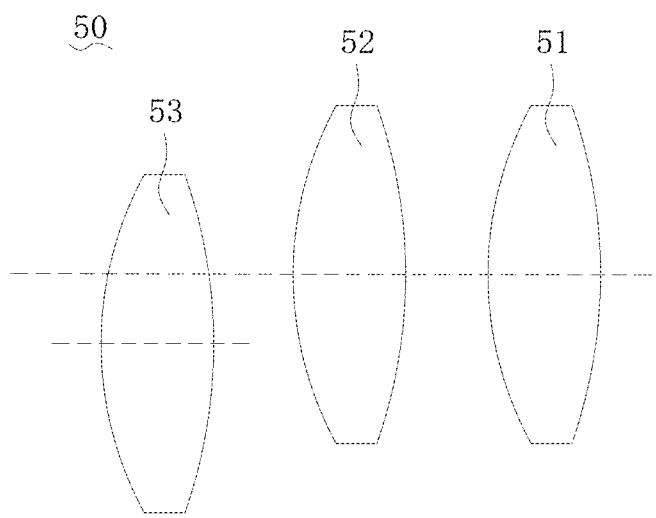
Figure 13:
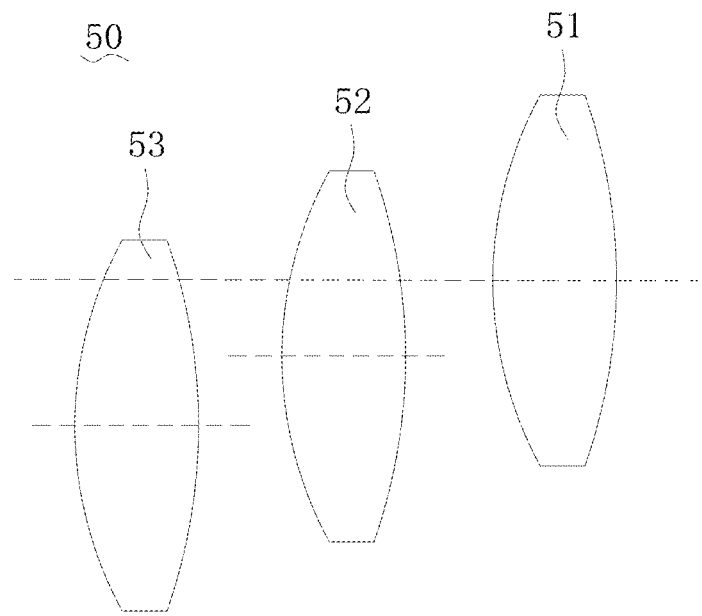
Figure 14:
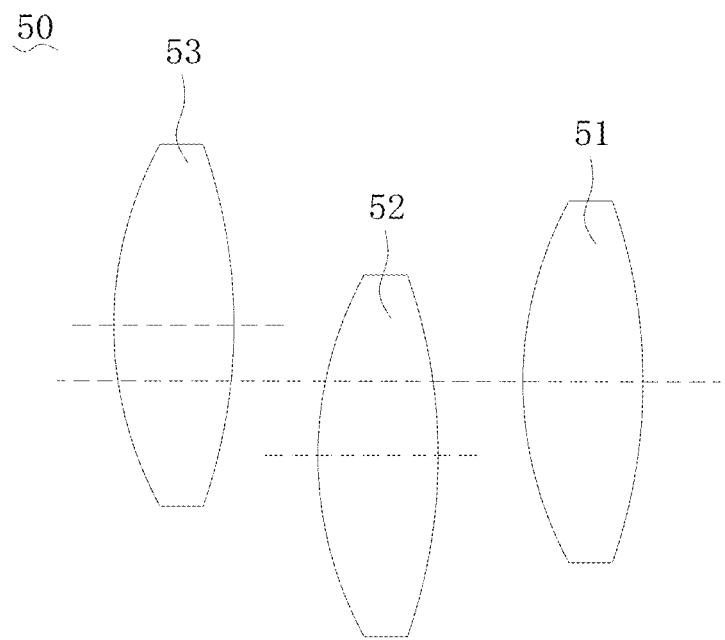

For example: as illustrated in FIG. 10 to FIG. 14, the collimation element 50 includes the first lens 51, the second lens 52 and the third lens 53. The first lens 51, the second lens 52 and the third lens 53 are provided in the light emitting path of the light source 40 in sequence. An optical axis of the second lens 52 is offset relative to an optical axis of the first lens 51, and the optical axis of the first lens 51 coincides with an optical axis of the third lens 53 (as illustrated in FIG. 10). Furthermore, the optical axis of the second lens 52 may be parallel to the optical axis of the first lens 51. In this case, the lens barrel 20 may have a two-segment structure. The first segment structure 26 is configured to install the first lens 51 and the second lens 52, and the second segment structure 27 is configured to install the third lens 53. The first segment structure 26 is connected to the second segment structure 27 in an inclined manner, and the second lens 52 is installed at a junction of the first segment structure 26 and the second segment structure 27. Thus, a bent structure defined by the plurality of lenses facilitates increasing the optical path length, thereby reducing an overall height of the laser projection unit 100. Inner walls of the first segment structure 26 and the second segment structure 27 are coated with reflective coatings for reflecting lights, such that lights emitted by the light source 40 may pass through the first light incident face 511, the first light emitting face 512, the second light incident face 521, the second light emitting face 522, the third light incident face 531 and the third light emitting face 532 in sequence. Of course, in other embodiments, the first segment structure 26 and the second segment structure 27 may also be reflective elements separate from the lens barrel 20. The reflective elements are provided to the lens barrel 20. The reflective elements are prisms or mirrors, and are configured to reflect lights to change the direction of an optical path. Or, the optical axis of the first lens 51 is offset relative to the optical axis of the second lens 52, and the optical axis of the second lens 52 coincides with the optical axis of the third lens 53 (as illustrated in FIG. 11). Furthermore, the optical axis of the first lens 51 may be parallel to the optical axis of the second lens 52. Or, the optical axis of the third lens 53 is offset relative to the optical axis of the first lens 51, and the optical axis of the first lens 51 coincides with the optical axis of the second lens 52 (as illustrated in FIG. 12). Furthermore, the optical axis of the third lens 53 may be parallel to the optical axis of the first lens 51. Or, the optical axis of the second lens 52 is offset relative to the optical axis of the first lens 51, the optical axis of the third lens 53 is offset relative to the optical axis of the first lens 51, and the optical axis of the second lens 52 and the optical axis of the third lens 53 are located at the same side of the optical axis of the first lens 51 (as illustrated in FIG. 13). Furthermore, the optical axis of the first lens may be parallel to the optical axis of the second lens 52, the optical axis of the first lens 51 is parallel to the optical axis of the third lens 53, and the optical axis of the second lens 52 is parallel to the optical axis of the third lens 53. Or, the optical axis of the second lens 52 is offset relative to the optical axis of the first lens 51, the optical axis of the third lens 53 is offset relative to the optical axis of the first lens 51, and the optical axis of the second lens 52 and the optical axis of the third lens 53 are located at different sides of the optical axis of the first lens 51 (as illustrated in FIG. 14). Furthermore, the optical axis of the first lens 51 may be parallel to the optical axis of the second lens 52, the optical axis of the first lens 51 is parallel to the optical axis of the third lens 53, and the optical axis of the second lens 52 is parallel to the optical axis of the third lens 53.

Figure 15:
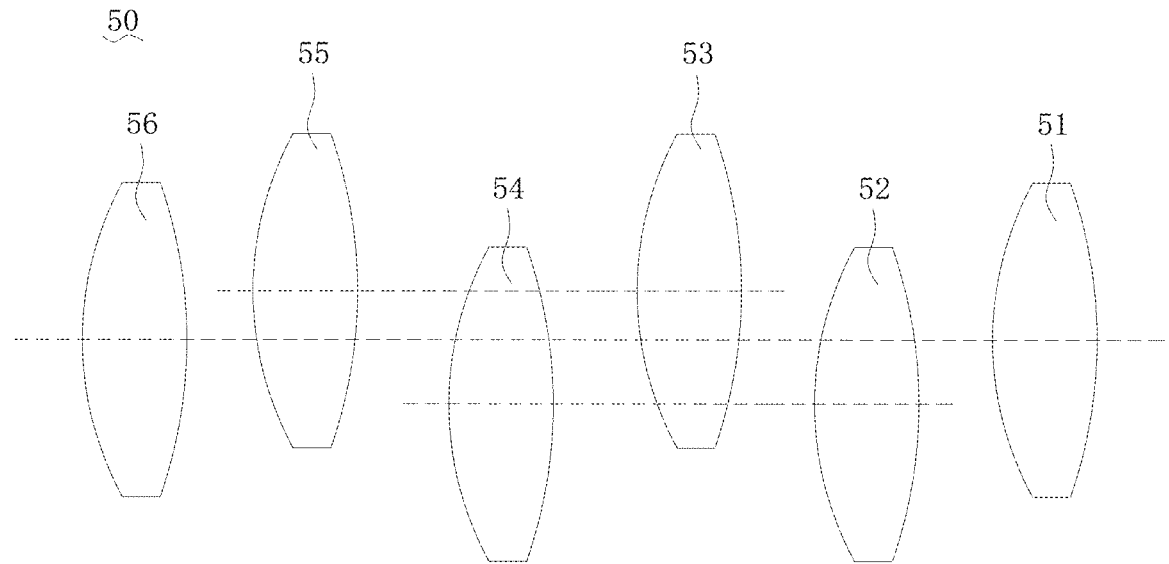

Preferably, the optical axis of the second lens 52 is offset relative to the optical axis of the first lens 51, the optical axis of the third lens 53 is offset relative to the optical axis of the first lens 51, and the optical axis of the second lens 52 and the optical axis of the third lens 53 are located at different sides of the optical axis of the first lens 51. In this case, a bent structure defined by the plurality of lenses facilitates increasing an optical path length, lengthening a focal length and reducing a height of the laser projection unit 100. Of course, the collimation element 50 may include a larger number of lenses. For example, as illustrated in FIG. 15, the collimation element 50 includes the first lens 51, the second lens 52, the third lens 53, the fourth lens 54, a fifth lens 55 and a sixth lens 56. The first lens 51, the second lens 52, the third lens 53, the fourth lens 54, the fifth lens 55 and the sixth lens 56 are provided in the light emitting path of the light source 40 in sequence. The optical axis of the second lens 52 is offset relative to the optical axis of the first lens 51, the optical axis of the third lens 53 is offset relative to the optical axis of the first lens 51, and the optical axis of the second lens 52 and the optical axis of the third lens 53 are locate at different sides of the optical axis of the first lens 51. The optical axis of the fourth lens 54 coincides with the optical axis of the second lens 52, the optical axis of the fifth lens 55 coincides with the optical axis of the third lens 53, and the optical axis of the sixth lens 56 coincides with the optical axis of the first lens 51.

It should be noted that in the laser projection unit 100 illustrated in FIGS. 11-15, the structure of the lens barrel 20 may be identical or similar to that of the lens barrel 20 illustrated in FIG. 10. The lens barrel 20 may have a one-segment or multi-segment structure, which will not be described herein.

In some embodiments, the collimation element 50 includes the plurality of lenses. Optical centers of at least two of the lenses are located in the same plane perpendicular to a first direction, and the first direction is a direction from the light source 40 to the diffractive optical element 60.

Figure 17:
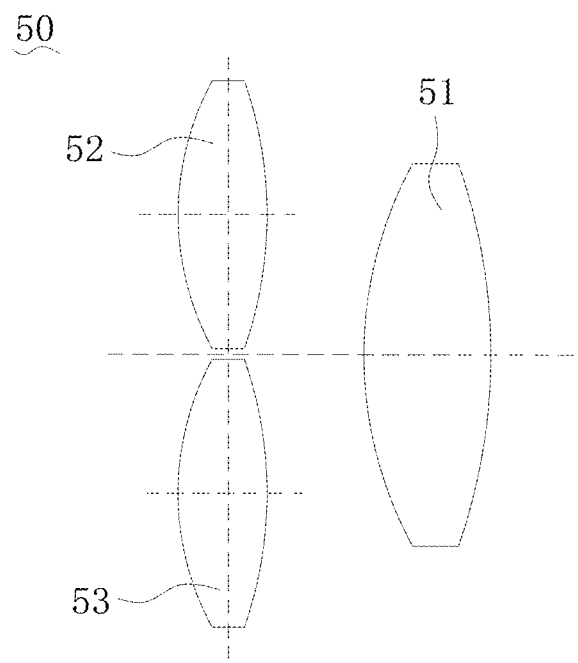
Figure 18:
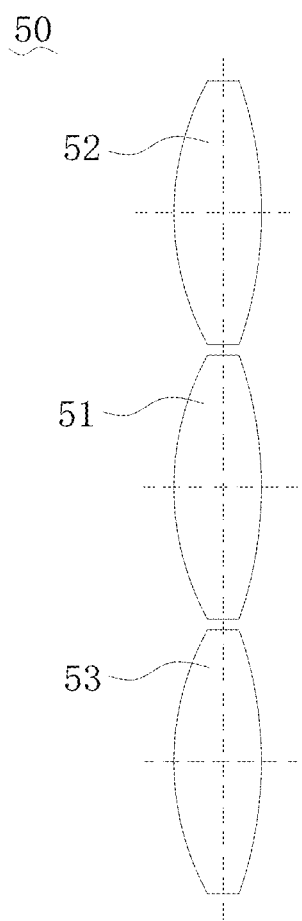

For example, as illustrated in FIGS. 16-18, the collimation element 50 includes the first lens 51, the second lens 52 and the third lens 53. An optical center of the first lens 51 and an optical center of the second lens 52 are in the same plane (as illustrated in FIG. 16), and the optical axis of the first lens 51 and the optical axis of the second lens 52 may be located at different sides of the optical axis of the third lens 53. Or, the optical center of the second lens 52 and an optical center of the third lens 53 are in the same plane (as illustrated in FIG. 17), and the optical axis of the second lens 52 and the optical axis of the third lens 53 may be located at different sides of the optical axis of the first lens 51. Or, the optical center of the first lens 51 and the optical center of the third lens 53 are in the same plane. Or, the optical center of the first lens 51, the optical center of the second lens 52 and the optical center of the third lens 53 are all in the same plane (as illustrated in FIG. 18). Furthermore, the optical axis of the first lens 51 may be parallel to the optical axis of the second lens 52, the optical axis of the first lens 51 is parallel to the optical axis of the third lens 53, and the optical axis of the second lens 52 is parallel to the optical axis of the third lens 53.

As illustrated in FIG. 1, the diffractive optical element 60 is configured to diffract the laser collimated by the collimation element 50 to form a laser pattern. The diffractive optical element 60 includes a diffraction emission face 61 and diffractive incident face 62 opposite to each other. The protective cover 30 may be adhered to the top portion 22 by glue. The abutment face 31 abuts against the diffraction emission face 61. The diffractive incident face 62 abuts against the supporting stage 25, such that the diffractive optical element 60 will not fall from the accommodating chamber 21 along the light emitting direction. The diffractive optical element 60 may be made of glass or composite materials (such as PET).

While assembling the above-mentioned laser projection unit 100, the collimation element 50 and the substrate assembly 10 installed with the light source 40 are sequentially placed in the through hole 24 from the bottom portion 23 of the lens barrel 20 along the optical path. The light source 40 may be first installed on the substrate assembly 10, and then the substrate assembly 10 installed with the light source 40 is fixed to the bottom portion 23. The diffractive optical element 60 is placed in the through hole 24 from the top portion 22 in a direction opposite to the optical path, and supported by the supporting stage 25. And then the protective cover 30 is installed, and the diffraction emission face 61 of the diffractive optical element 60 is made abut against the protective cover 30 and the diffractive incident face 62 is made abut against the supporting stage 25. The laser projection unit 100 has a simple structure and is easy to be assembled.

As illustrated in FIG. 19, the depth camera 400 according to embodiments of the present application includes the laser projection unit 100 according to any one of the above embodiments, an image acquirer 200 and a processor 300. The image acquirer 200 is configured to acquire a laser pattern projected into a target space after passing through the diffractive optical element 50. The processor 300 is coupled to the laser projection unit 100 and the image acquirer 200 separately. The processor 300 is configured to process the laser pattern to obtain a depth image.

Specifically, the laser projection unit 100 projects the laser pattern projected into the target space outward through a projection window 401. The image acquirer 200 acquires the laser pattern modulated by a target object through an acquisition window 402. The image acquirer 200 may be an infrared camera. The processor 300 calculates a deviation value of each pixel point in the laser pattern and a corresponding pixel point in a reference pattern with an image matching algorithm, and then obtains the depth image of the laser pattern based on the deviation value. The image matching algorithm may be a digital image correlation (DIC) algorithm. Certainly, other image matching algorithms may be adopted to replace the DIC algorithm.

As illustrated in FIG. 20, the electronic device 1000 according to embodiments of the present application includes a housing 500 and the depth camera 400 according to the above embodiments. The depth camera 400 is provided in the housing 500 and exposed out of the housing 500 to acquire the depth image. The electronic device 1000 includes, but is not limited to, a mobile phone, a tablet computer, a laptop computer, a smart bracelet, a smart watch, a smart helmet, smart glasses and so on.

Reference throughout this specification to "an embodiment", "some embodiments", "an exemplary embodiment", "an example", "a specific example", or "some examples" means that a particular feature, structure, material, or characteristic described in connection with the embodiment or example is included in at least one embodiment or example of the present application. In this specification, exemplary descriptions of aforesaid terms are not necessarily referring to the same embodiment or example. Furthermore, the particular features, structures, materials, or characteristics may be combined in any suitable manner in one or more embodiments or examples.

Although embodiments of present application have been shown and described above, it should be understood by those skilled in the art that above embodiments are just explanatory, and cannot be construed to limit the present application, changes, modifications, alternatives and variations can be made to the embodiments without departing from the scope of the present application.

What is claimed is:

1. A laser projection unit, comprising:
a light source configured to emit laser;
a collimation element configured to collimate the laser, and the collimation element comprising a plurality of lenses, the plurality of lenses being provided in a light emitting path of the light source; and
a diffractive optical element configured to diffract the laser collimated by the collimation element to form a laser pattern;
wherein the plurality of the lenses comprise at least one first type lens and at least one second type lens, the first type lens is made of glass, and the second type lens is made of plastic,
wherein the plurality of lenses comprise a first lens, a second lens and a third lens, the first lens, the second lens and the third lens are provided in the light emitting path of the light source in sequence, an optical axis of the second lens is offset relative to an optical axis of the first lens, and the optical axis of the first lens coincides with an optical axis of the third lens;
the laser projection unit further comprises a lens barrel, the lens barrel comprises a first segment structure and a second segment structure, the first segment structure is connected to the second segment structure in an inclined manner, the first segment structure is configured to install the first lens and the second lens, and the second segment structure is configured to install the third lens, inner walls of the first segment structure and the second segment structure are coated with reflective coatings for reflecting lights, such that lights emitted by the light source is capable of passing through the first lens, the second lens and the third lens in sequence.

2. The laser projection unit according to claim 1, wherein the collimation element comprises the plurality of lenses provided in the light emitting path of the light source in sequence, an optical axis of at least one of the plurality of lenses is offset relative to an optical axis of each other of the plurality of lenses.

3. The laser projection unit according to claim 1, wherein the collimation element comprises the plurality of lenses, optical centers of at least two of the lenses are located in the same plane perpendicular to a first direction, and the first direction is a direction from the light source to the diffractive optical element.

4. The laser projection unit according to claim 1, wherein the light source is a vertical cavity surface emitting laser; or the light source is an edge-emitting laser.

5. The laser projection unit according to claim 1, wherein the light source is the edge-emitting laser, the light source comprises the light emitting face, and the light emitting face faces the light collimation element.

6. The laser projection unit according to claim 1, wherein the laser projection unit further comprises a substrate assembly and a lens barrel, the lens barrel is provided to the substrate assembly and defines an accommodating chamber together with the substrate assembly, and the light source, the collimation element and the diffractive optical element are accommodated in the accommodating chamber.

7. The laser projection unit according to claim 6, wherein the substrate assembly comprises a substrate and a circuit board supported on the substrate, the circuit board defines a hole therein, and the light source is supported on the substrate and accommodated in the hole.

8. A depth camera, comprising:
a laser projection unit comprising:
a light source configured to emit laser;
a collimation element configured to collimate the laser, and the collimation element comprising a plurality of lenses provided in a light emitting path of the light source; and
a diffractive optical element configured to diffract the laser collimated by the collimation element to form a laser pattern;
an image acquirer configured to acquire a laser pattern projected into a target space after passing through the diffractive optical element; and
a processor coupled to the laser projection unit and the image acquirer separately, the processor being configured to process the laser pattern to obtain a depth image;
wherein the plurality of the lenses comprise at least one first type lens and at least one second type lens, the first type lens is made of glass, and the second type lens is made of plastic,
wherein the plurality of lenses comprise a first lens, a second lens and a third lens, the first lens, the second lens and the third lens are provided in the light emitting path of the light source in sequence, an optical axis of the second lens is offset relative to an optical axis of the first lens, and the optical axis of the first lens coincides with an optical axis of the third lens;
the laser projection unit further comprises a lens barrel, the lens barrel comprises a first segment structure and a second segment structure, the first segment structure is connected to the second segment structure in an inclined manner, the first segment structure is configured to install the first lens and the second lens, and the second segment structure is configured to install the third lens, inner walls of the first segment structure and the second segment structure are coated with reflective coatings for reflecting lights, such that lights emitted by the light source is capable of passing through the first lens, the second lens and the third lens in sequence.

9. An electronic device, comprising:
a housing; and
a depth camera comprising:
a laser projection unit comprising:
a light source configured to emit laser;
a collimation element configured to collimate the laser, and the collimation element comprising a plurality of lenses provided in a light emitting path of the light source; and
a diffractive optical element configured to diffract the laser collimated by the collimation element to form a laser pattern;
an image acquirer configured to acquire a laser pattern projected into a target space after passing through the diffractive optical element; and
a processor coupled to the laser projection unit and the image acquirer separately, the processor being configured to process the laser pattern to obtain a depth image,
the depth camera being provided in the housing and exposed out of the housing to acquire the depth image;
wherein the plurality of the lenses comprise at least one first type lens and at least one second type lens, the first type lens is made of glass, and the second type lens is made of plastic,
wherein the plurality of lenses comprise a first lens, a second lens and a third lens, the first lens, the second lens and the third lens are provided in the light emitting path of the light source in sequence, an optical axis of the second lens is offset relative to an optical axis of the first lens, and the optical axis of the first lens coincides with an optical axis of the third lens;
the laser projection unit further comprises a lens barrel, the lens barrel comprises a first segment structure and a second segment structure, the first segment structure is connected to the second segment structure in an inclined manner, the first segment structure is configured to install the first lens and the second lens, and the second segment structure is configured to install the third lens, inner walls of the first segment structure and the second segment structure are coated with reflective coatings for reflecting lights, such that lights emitted by the light source is capable of passing through the first lens, the second lens and the third lens in sequence.

10. The laser projection unit according to claim 1, wherein the collimation element comprises a first lens, the first lens comprises a first light incident face and first light emitting face opposite to each other, the first light incident face is a concave face, and the first light emitting face is a convex face.

11. The laser projection unit according to claim 1, wherein the collimation element comprises a plurality of lenses, the plurality of lenses are coaxial with each other and provided in the light emitting path of the light source in sequence.

12. The laser projection unit according to claim 11, wherein the plurality of lenses comprise a first lens and a second lens, the first lens comprises a first light incident face and a first light emitting face opposite to each other, the second lens comprises a second light incident face and a second light emitting face opposite to each other, an apex of the first light emitting face abuts against an apex of the second light incident face, the first light incident face is a concave face, and the second light emitting face is a convex face.

13. The laser projection unit according to claim 12, wherein the first light emitting face and the second light incident face are both convex faces.

14. The laser projection unit according to claim 11, wherein the plurality of lenses comprise a first lens, a second lens and a third lens, the first lens comprises a first light incident face and a first light emitting face opposite to each other, the second lens comprises a second light incident face and a second light emitting face opposite to each other, the third lens comprises a third light incident face and a third light emitting face opposite to each other, the third light incident face is a concave face, and the third light emitting face is a convex face.

15. The laser projection unit according to claim 14, wherein the first light incident face is a convex face, the first light emitting face is a concave face, the second light incident face is a concave face, and the second light emitting face is a concave face.

16. The laser projection unit according to claim 1, wherein the plurality of lenses comprise a first lens, a second lens and a third lens,
   the first lens is the first type lens, and the second lens and the third lens are the second type lenses; or the second lens is the first type lens, and the first lens and the third lens are the second type lenses; or the third lens is the first type lens, and the first lens and the second lens are the second type lenses; or the first lens and the second lens are the first type lenses, and the third lens is the second type lens; or the second lens and the third lens are the first type lenses, and the first lens is the second type lens; or the first lens and the third lens are the first type lenses, and the second lens is the second type lens.

17. The laser projection unit according to claim 1, wherein the plurality of lenses comprise four lenses,
   two of the four lenses are the first type lenses, and the other two of the four lenses are the second type lenses; or one of the four lenses is the first type lens, and the other three of the four lenses are the second type lenses; or three of the four lenses are the first type lenses, and the other of the four lenses is the second type lens.

18. The laser projection unit according to claim 2, wherein the optical axis of the at least one of the plurality of the lenses is parallel to an optical axis of each other of the plurality of lenses.

* * * * *